(12) United States Patent
Karimi et al.

(10) Patent No.: US 6,681,358 B1
(45) Date of Patent: Jan. 20, 2004

(54) PARALLEL TESTING OF A MULTIPORT MEMORY

(75) Inventors: Farzin Karimi, Rolindale, MA (US); Thompson W. Crosby, San Jose, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/510,009

(22) Filed: Feb. 22, 2000

(51) Int. Cl.$^7$ .............................................. G01R 31/28
(52) U.S. Cl. ...................................................... 714/733
(58) Field of Search ................................ 714/718, 733; 365/201

(56) References Cited

U.S. PATENT DOCUMENTS

| | | | |
|---|---|---|---|
| 5,822,228 A | 10/1998 | Irrinki et al. ................ | 364/580 |
| 5,909,404 A | 6/1999 | Schwarz ...................... | 365/201 |

OTHER PUBLICATIONS

Wu et al., Built–in Self Test for Multi–Port RAMs, 1997, IEEE, pp. 398–403.*
T. Matsumura, An Efficient Test MEthod for Embedded Multi–Port Ram with BIST Circuitry, 1995, IEEE, pp. 62–67.*
Alves et al., A New Class of Fault Models and Test Algorithms for Dual–Port Dynamic RAM Testing, 1993, IEEE, pp. 68–71.*
Amin et al., New fault models and efficient BIST algorithm for Dual–port Memories, Sep. 1997, IEEE transactions on computer–aided design of IC and Sys., vol. 16, No. 9, pp. 987–1000.*
Yokoyama et al., Built–in Random testing for dual–port RAM's, 1994, IEEE, pp. 2–6.*
Moving Inversions Test Pattern Is Thorough, Yet Speedy, J. Henk de Jonge et al., Philips Data Systems, Apeldorn, The Netherlands (5 p.).
4–Kilobit Memories Present a Challenge to Testing, E. R. Hnatek, Computer Design, May 1975, pp. 117–125.

* cited by examiner

Primary Examiner—Albert Decady
Assistant Examiner—Shelly A Chase
(74) Attorney, Agent, or Firm—Conley Rose, P.C.

(57) ABSTRACT

A multiport BIST method and apparatus therefor are disclosed. The multiport BIST is advantageously based on adapting a single port BIST method by dividing the memory into sections based on the number of ports and applying the single port BIST simultaneously through all ports simultaneously (inverting where appropriate), so as to test the sections in parallel. In one embodiment of the invention, an integrated circuit device comprises a multiport memory and a built-in self-test (BIST) unit that applies a first test pattern of read and write operations to a first port of the memory and applies a second test pattern of read and write operations to a second port of the memory. The addresses in the first test pattern are offset from addresses in the second test pattern by a fixed amount. The ports preferably have adjacent bit lines, and the data values conveyed by the first and second test patterns are preferably complementary. Also, the fixed amount is preferably selected so that the read and write operations of the first and second port are concurrently directed to memory words that share common bit lines.

20 Claims, 3 Drawing Sheets

PARALLEL TESTING OF A MULTIPORT MEMORY

BACKGROUND OF THE INVENTION

1. Field of the Invention

This invention relates to the field of digital electronic memory devices, and in particular to an efficient method and apparatus for testing multiport memories.

2. Description of the Related Art

It is common practice for the manufacturers of memory chips to test the functionality of the memories at the manufacturing site. After the chips have been tested and certified for shipment, upon sale to the users, the users generally depend upon the reliability of the chips for their own systems to function properly. As the line width of memory cells within a memory array circuit chip continue to shrink (now at less than half a micron), this reliability becomes more difficult to achieve. One of the challenges for the manufacturers of memory devices, is to increase memory capacity without decreasing chip yields due to malfunctioning parts.

Before the memory chips are released for shipment, they typically undergo testing to verify that the support circuitry for the memory array and each of the memory cells within the memory array is functioning properly. This testing is routinely done because it is not uncommon for a significant percentage of the memory cells within the chip to fail, either because of manufacturing defects or degradation faults.

One standard way for testing chip memories involves using an external memory tester, or Automatic Test Equipment (ATE), at the manufacturing site. An external memory tester supplies power and applies test patterns to the chip to detect faults. External memory testers can only test a limited number of chips at a time, and the test speed is limited by the external bus speed. Consequently, this method of testing is expensive, both in terms of equipment costs and time requirements.

Partly to address these issues, and partly to provide off-site testing, built-in self-test (BIST) units have been incorporated into memory chips as a matter of course. Automated test equipment can now be simplified to the extent that the only necessary functions are to supply power (and sometimes a clock signal) to the memory chip, and to monitor a single output signal from the chip. The on-board BIST unit generates all the test patterns and asserts the output signal if the chip passes the functionality test. The BIST can be configured to run every time the chip is powered-on, or the BIST may be configured to run only when a test mode signal is asserted.

The BIST unit operates by writing and reading various patterns to/from the memory to determine various kinds of memory faults. In general, a BIST unit writes a data value to a memory cell and subsequently reads the memory cell. By comparing the data written and the data subsequently returned from the memory cell, the BIST unit is able to determine whether the memory cell is faulty. Since the functionality of a cell may depend on the data values stored by neighboring cells or the data values carried on nearby bit and word lines, verifying complete cell functionality is a highly combinatorial problem that requires an impractical amount of time for large memories.

However, it has been recognized that certain faults are more common and easier to detect than others. These include: unlinked memory cell faults such as "stuck-at" faults, transition faults, and data retention faults; simple-coupling cell faults such as inversion faults, idempotent faults, bridging faults, state faults, and disturbance faults; addressing faults and read/write faults. Less common and more difficult to detect are linked faults, neighborhood pattern sensitive faults, and complex coupling faults, all of which involve three or more memory cells. These and other faults are described at length in co-pending U.S. patent application Ser. No. 09/363,697, filed Jul. 28, 1991, which is hereby incorporated herein by reference. In the interest of practicality, BIST algorithms are typically designed to screen for only certain types of faults.

Several classes of fault detection methods are well known, as illustrated by E. R. Hnatek in "4-Kilobit Memories Present a Challenge to Testing", *Computer Design, May 1975*, pp. 117–125, which is hereby incorporated herein by reference. As Hnatek discusses, there are several considerations that should be taken into account when selecting a fault detection method, including fault coverage and length of the test procedure. Also, since no practical method provides complete coverage, the suitability of the various methods for detecting particular types of faults should be considered. The most popular class of fault detection methods is represented by the March C algorithm and its variants such as March C−, March C+, Smarch, or March L R.

With multiport memories, the likelihood of shorts or excess coupling between word lines or bit lines increases substantially relative to single port memories. Ideally, one port can access any row of cells while another port is accessing another row of cells without interference between the two ports, since the ports do not share word lines and bit lines. In reality, however, manufacturing defects can cause one port to interfere with another port, affecting the data values that are read or written through either port. Consequently the various ports need to be exercised simultaneously to verify functionality. Existing methods include: (1) the Single Port BIST method, (2) the Shadow Read method, and (3) the Dual Port method. In addition to these methods, other methods exist. However, these other methods require one or more modifications of the memory array circuitry, which is generally considered to be undesirable.

The Single Port BIST method simply conducts a standard single port BIST through one port while disabling the other ports. This BIST is then repeated for each of the other ports in turn. The standard single port BIST is then repeated. This method ignores the potential for interport faults.

The Shadow Read method is similar to the Single Port BIST method. However, instead of disabling the other ports, a "shadow" read operation is conducted on these ports concurrently with each of the BIST operations through the current test port. Although the data read from these ports is discarded, these read operations get the bit lines for these ports to carry data complementary to the data on the bit lines of the test port. Shorts between the bit lines of different ports can thereby be detected. Unfortunately, only one port at a time is exercised relative to other ports, so that the test time increases in proportion with the number of various combinations of adjacent bit lines.

The Dual Port method is directed toward two port memories. Two BIST operations are run simultaneously, with one port starting at the lowest address and progressing upward, and the other port starting at the highest address and progressing downward. While an existing single-port BIST circuit may be adapted to implement this operation (by complementing the address of the first port to generate the address of the second port), many memory topologies will have the concurrent memory accesses occurring in different columns, so that shorts between bitlines are not detected.

Consequently, these techniques are inadequate. A need exists for a multiport BIST technique that is fast, exhibits good coverage, and requires a minimum of additional complexity relative to a single port BIST.

SUMMARY OF THE INVENTION

Accordingly, there is disclosed herein a multiport BIST method advantageously based on adapting a single port BIST method by dividing the memory into sections based on the number of ports and applying the single port BIST simultaneously through all ports simultaneously (inverting where appropriate), so as to test the sections in parallel. In one embodiment of the invention, an integrated circuit device comprises a multiport memory and a built-in self-test (BIST) unit that applies a first test pattern of read and write operations to a first port of the memory and applies a second test pattern of read and write operations to a second port of the memory. The addresses in the first test pattern are offset from addresses in the second test pattern by a fixed amount. The ports preferably have adjacent bit lines, and the data values conveyed by the first and second test patterns are preferably complementary. Also, the fixed amount is preferably selected so that the read and write operations of the first and second port cause concurrent accesses to adjacent bit lines or adjacent word lines.

The disclosed technique advantageously provides for detection of interport faults with no loss of fault coverage provided by the original BIST. Further, since the ports are being tested simultaneously, the test time required by the disclosed technique is the same as that required by the original BIST. Consequently, the disclosed technique for adapting a single port BIST to a multiport memory advantageously adds interport fault detection while maintaining a test time that is independent of the number of ports.

BRIEF DESCRIPTION OF THE DRAWINGS

Other objects and advantages of the invention will become apparent upon reading the following detailed description and upon reference to the accompanying drawings in which.

Figure 1:
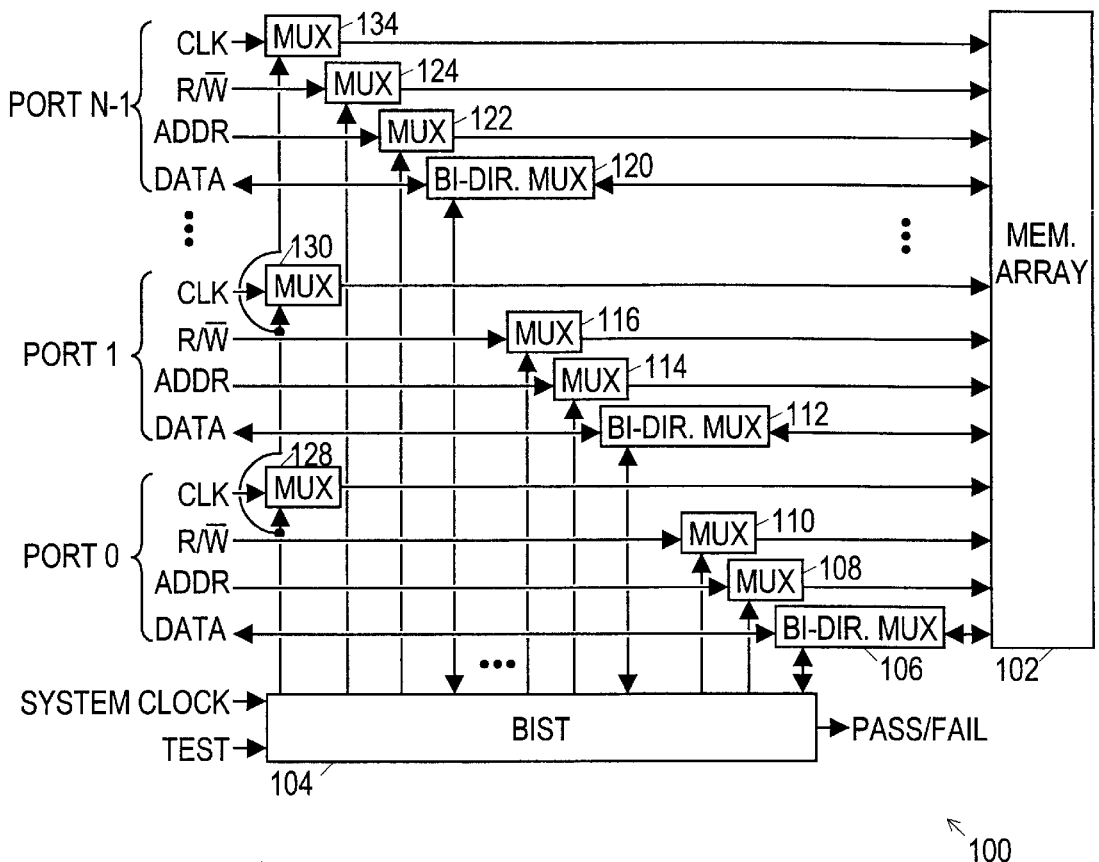
FIG. 1 shows a functional block diagram of a memory with a multi-port BIST.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "de-assert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high.

DETAILED DESCRIPTION OF THE INVENTION

Turning now to FIG. 1, device 100 includes a multiport memory array 102 and a BIST unit 104 which is coupled to the memory array through multiplexers 106–134 that may be controlled by BIST 104. Each of the memory ports 0 through N−1 have a set of signal lines that include a clock line (CLK), a read/write line (R/$\overline{\text{W}}$), a set of address lines (ADDR), and a set of bi-directional data lines (DATA). From each port, the memory array 102 receives an address signal, a read/write signal, and a clock signal, and either receives or provides a data signal. If the read/write signal indicates a write operation, memory array 102 stores the data represented by the data signal in a memory location indicated by the address signal. If the read/write signal indicates a read operation, memory array 102 detects the data stored in the memory location indicated by the address signal and drives the data signal on the data lines. The multiplexers 106–134 provide for steering and re-direction of the address, data, clock, and read/write signals.

When a test mode signal (TEST) to the BIST 104 is asserted, BIST 104 switches the multiplexers 106–134 so that the BIST 104 has access to the signal lines of each port. The test signal may be asserted by an operating system or software application running on a CPU coupled to the memory device 100, or it may be asserted in response to an event such as power-on, reset, reaching a predetermined temperature, or expiry of a predetermined time delay.

Multiplexers 106, 112 and 120 are bi-directional so that BIST 104 can both read from and write to memory array 102. In the configuration shown in FIG. 1, the BIST unit 104 generates a shared clock signal from the system clock signal (SYSTEM CLOCK). The shared clock signal is provided to clock multiplexers 128–134 so that, during testing of multiport memory array 102, each of the ports is clocked by the shared clock signal. BIST unit 104 applies a multiport test pattern to memory array 102 using the common clock signal, and upon completion of the test, asserts the pass/fail signal to indicate if no faults have been detected or de-asserts the pass/fail signal to indicate that one or more faults have been detected. Typical faults detected by BIST include column faults, row faults, bridging faults, "stuck-at" faults, and data retention faults. Column and row faults are caused by defective bit lines and defective word lines, respectively. A bridging fault indicates a cell is shorted to an adjoining cell, and stuck-at faults indicate a particular cell is "stuck" at a certain value. Data retention faults indicate the cell has failed to retain the data written to it.

Figure 2:
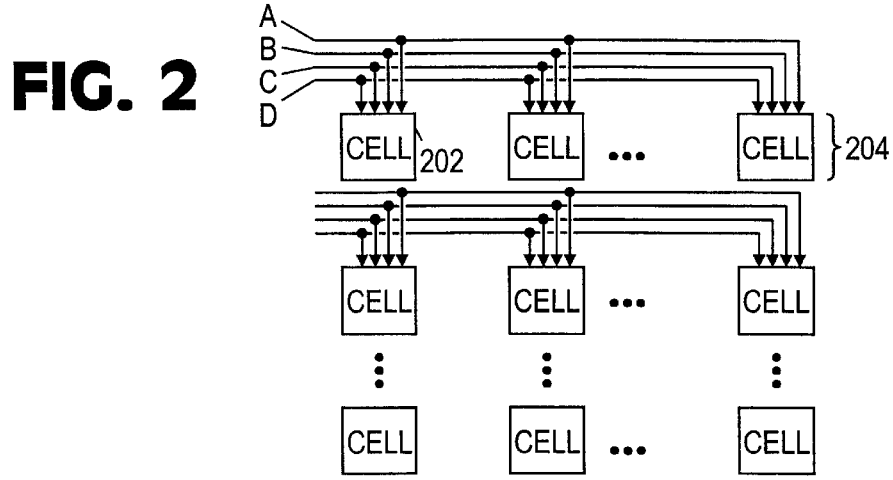
FIG. 2 shows a schematic diagram of the word lines in a memory array.

FIG. 2 shows an exemplary multiport memory cell array having a typical word line configuration. (For clarity, bit line configurations are shown separately in FIGS. 3 and 4.) The array is organized into words of one or more memory cells 202. Each port has an associated word line for each word in the array. The word lines are each coupled to all of the cells in the corresponding word, The word lines for word 204 are labeled with port names A, B, C, and D. Assertion of a word line for a given port "opens" that word's memory cells for access via the bit lines of that port.

Figure 3:
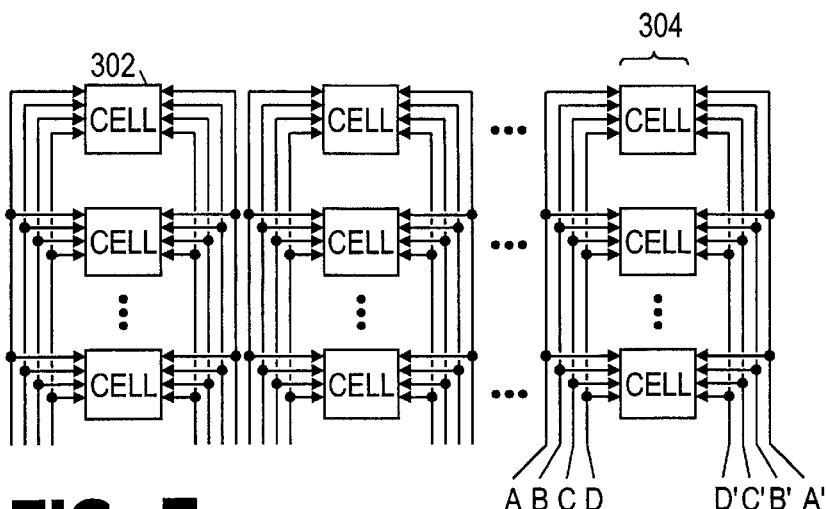
FIG. 3 shows a schematic diagram of the bit lines in a first memory array embodiment.
Figure 4:
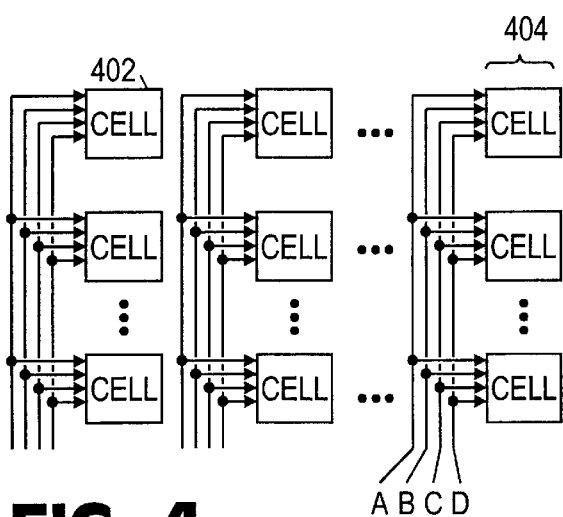
FIG. 4 shows a schematic diagram of the bit lines in a second memory array embodiment.

Herein, the set of word lines that can be used to access a given memory word are said to be neighboring word lines. Any two word lines in a memory array that have no other word lines between are said to be adjacent word lines. Similar usage is applied to the bit lines, so that the bit lines that can be used to transport data to or from a given memory cell are said to be neighboring bit lines, while adjacent bit lines have no other bit lines between them. As shown in FIGS. 3 and 4, the memory cells in a column of the memory array share a common set of neighboring bit lines.

FIGS. 3 and 4 show exemplary multiport memory cell arrays having typical bit line configurations. FIG. 3 shows an array having cells 302 that, when enabled by assertion of a word line, drive or receive complementary values on pairs of bit lines associated with a given port. The bit lines for column 304 are labeled with port names A, B, C, and D. Each of these is paired with a complementary bit line A', B', C', and D', respectively. It is noted that the likelihood of a fault between bit lines of adjacent ports dominates over the likelihood of a fault between non-adjacent ports. Thus, for example, the bit lines of port B are much more likely to "bridge" to the bit lines of ports A and C than to port D. This observation also holds true for the array of FIG. 4, in which memory cells 402 each only drive or receive from a single bit line per port. The bit lines for column 404 are labeled with the port names, and again, the faults will be primarily between bit lines of adjacent ports.

Accordingly, when screening for interport faults, it is desirable to cause adjacent bit lines to be carrying complementary data. Other desirable considerations for a multiport BIST include low-complexity address and data pattern generation and short test time. These advantages are provided by a multiport BIST based on a single port BIST modified in the following way: the memory is divided into sections based on the number of ports, and a single port BIST is applied through all ports simultaneously (with inversions where appropriate), with each port starting in a different section.

Figure 5:
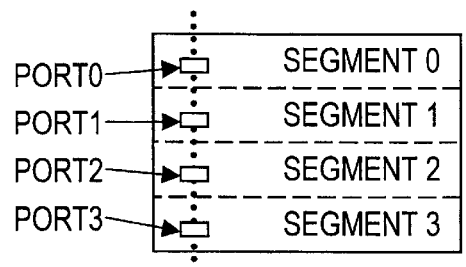
FIG. 5 shows a four port memory divided into four segments.

FIG. 5 shows a four-port memory divided into four segments. Although desirable, it is not necessary for the segments to be of equal size. BIST operations are conducted with port 0 starting in segment 0, port 1 starting in segment 1, and so on. As ports 0 and 2 read and write data to addresses in segments 0 and 2, ports 1 and 3 read and write complementary data to corresponding addresses in segments 1 and 3. This allows adjacent bit lines in a given column to carry complementary data.

Figure 8:
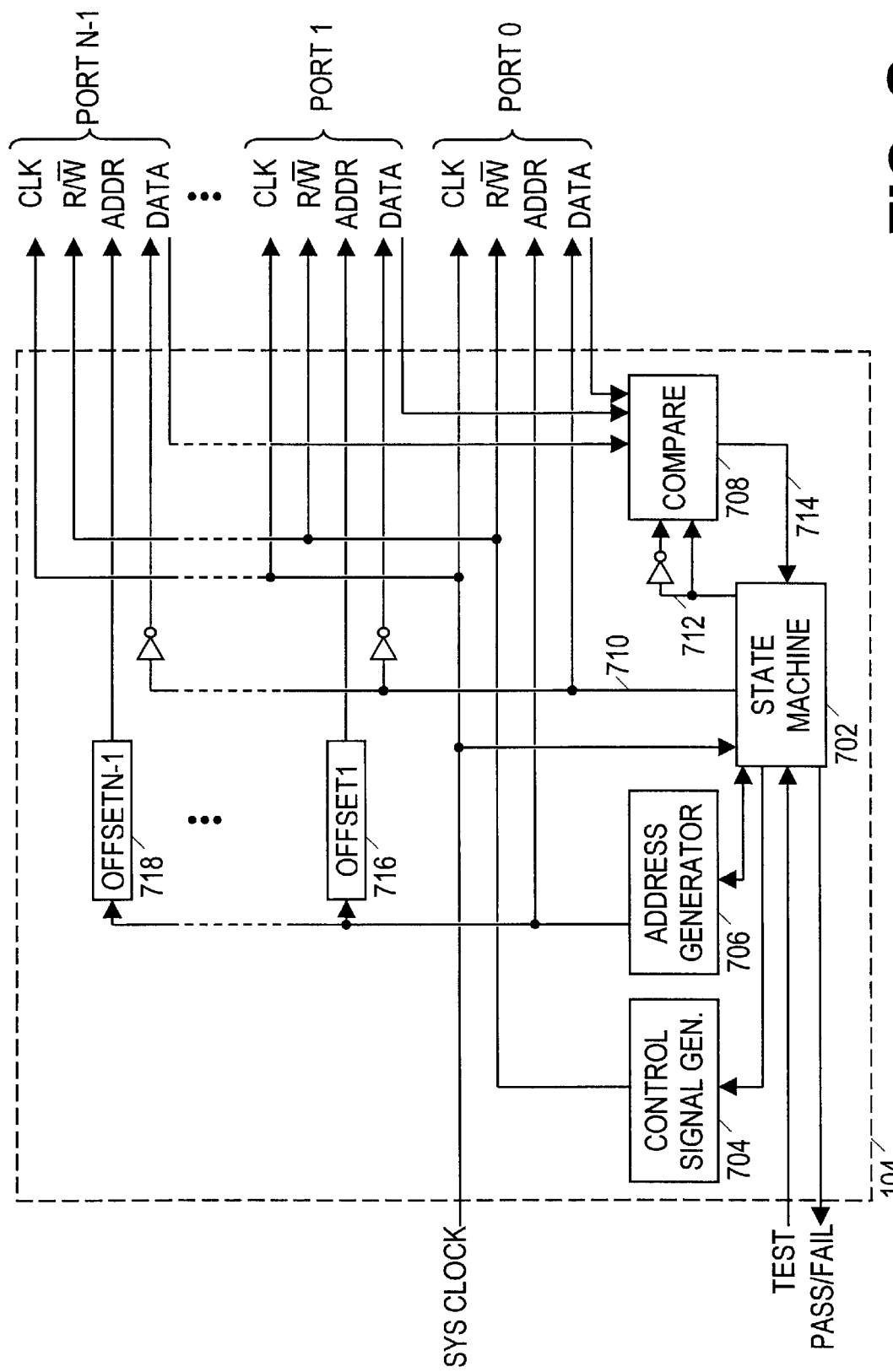
FIG. 8 shows a functional block diagram of a multiport memory BIST.

FIG. 8 shows an exemplary implementation of a multiport BIST 104 having a state machine 702, a control signal generator 704, an address generator 706, and a comparator 708. When the TEST signal is asserted, the state machine 702 begins by setting the address generator 706 to a starting address, setting the control signal generator 704 to provide a write signal, and providing a 0 data bit (for example) to every address via port 0. It is noted that where more complex data patterns are desired, a data generator may be provided to operate under control of state machine 702. Conversely, the state machine 702 may be configured to directly generate other signals in addition to the data signal 710. For example, control signal generator 704 may optionally be eliminated and the state machine 702 may generate the read and write signals.

During the BIST operation, the remaining ports also receive address and data signals derived from the address and data signals provided by state machine 702, and address generator 706. Port 0 receives the unmodified address from address generator 706, while the other ports receive the address with an added offset. The added offset corresponds to the location of the memory segments that the ports are assigned. It is noted that offsets 716 and 718 need not be added by adders. It is expected that a few logic gates can operate on the most significant bits of the address to achieve the effect of an added offset. For example, when the memory is divided into two equal segments, the address for port 1 may be obtained from the address for port 0 by simply inverting the most significant address bit. It is preferred that the data pattern provided to the odd numbered ports be the complement of the data pattern provided to the even numbered ports. This can be achieved with the use of inverters.

A comparator 708 is provided for receiving data actually received from the memory array and for comparing the received data to the expected data 712 specified by the state machine 702. The expected data 712 is inverted for comparison with the data received via the odd numbered ports, while the data received via the even numbered ports is compared to the uninverted expected data. Any mismatch causes comparator 708 to assert mismatch signal 714. This in turn may cause the state machine 702 to assert the FAIL signal and halt the BIST.

For illustrative purposes, an exemplary single port BIST algorithm is now described, and its adaptation to multiport memories explained.

A popular single-port memory BIST algorithm is the March C algorithm. The March C algorithm includes six "passes" termed herein the first (initialization), second (forward inversion), third (forward re-inversion), fourth (backward inversion), fifth (backward re-inversion), and sixth (verification) passes. Each of the passes accesses each memory address individually.

During the first pass, an initial test pattern is written to the cells. The test pattern may be any desired sequence of bits, such as a "checkerboard" pattern, but often comprises all 0's. The pattern values can be written in any order, although the memory locations usually are addressed consecutively from address 0 to address N−1 or from address N−1 to address 0, where N represents the number of memory addresses.

During the second, third, fourth, and fifth passes, each address is accessed consecutively, the contents read and verified, then the contents are inverted and written back to that address. In the second and third passes, the addresses are accessed in order (forward), and then in the fourth and fifth passes, the addresses are accessed in reverse order.

During the sixth pass, each of the addresses are read one final time to verify the contents. As with the first pass, the memory addresses may be read in any order, although traditionally in this pass, the addresses are accessed consecutively.

To repeat, a single port BIST algorithm is converted to a multiport memory BIST by dividing the memory into sections based on the number of ports, and applying a single port BIST through all ports simultaneously (with inversions where appropriate), with each port starting in a different section. Numerous embodiments of this basic idea may be practiced.

In a first embodiment using the March C algorithm (each-port-does-one-segment-at-a-time embodiment), the address generator performs the six passes of the March C algorithm P times over an address space of N/P, where P is the number of ports and N is the number of addresses. Port 0 initially tests segment 0, port 1 tests segment 1, and so on. The data pattern is applied through all ports simultaneously, with the data pattern for the odd numbered ports inverted relative to the data pattern for the even numbered ports. The offsets 716–718 cause each port to operate on a different segment. After six passes where the address generator 706 counts between 0 and (N/P)–1, the address generator then performs six passes counting between N/P and (2N/P)–1. This causes port 0 to test segment 1, port 1 to test segment 2, and so on, with port P–1 testing segment 0. This continues until each port has completed the BIST for each address in memory. It is noted that this embodiment may have redundancy that may be eliminated—i.e. the initialization pass could potentially be eliminated after the first segment is tested, so that only 5 passes are conducted for subsequent segment tests.

In a second embodiment (segment-starting-point embodiment) using the March C algorithm, the address generator performs the six passes only once over an address space of N. Again, the data pattern is applied through all ports simultaneously, with the data pattern for the odd numbered ports inverted relative to the data pattern for the even numbered ports. The offsets 716–718 cause each port to start at a different segment. In the first pass, the address generator is set to N–1, and counts downward to 0. At the conclusion of the first pass, the even-numbered segments should contain 0's, and the odd-numbered segments should contain 1's. It is noted that if equal segment sizes are employed, this pattern may alternatively be achieved in N/P operations, where N is the number of addresses and P is the number of ports. One implementation of this alternative approach has the address generator start at 0 and halt at address (N/P)–1.

In the second pass, the address generator 706 starts at 0 and counts to N–1. The state machine 702 provides the expected data 712 (which here is a 0 bit value) to comparator 708, provides the complementary data 710 (in this pass a 1 bit value) to port 0, and causes the control signal generator 704 to alternately provide read and write signals to each address. During the first read, each port reads the actual value stored in the first address of the corresponding segment (ideally 0 for even-numbered segments and ideally 1 for odd-numbered segments). The comparator 708 compares the read values to the expected data 712 (inverted as appropriate for each port), and asserts a mismatch signal whenever a mismatch is detected. Otherwise, the test proceeds and the complementary values are written to the first address of each segment (1's for even numbered segments and 0's for odd-numbered segments). In effect, this "moves" each segment forward by one address. The address is then incremented, and this pass continues until each port has accessed each memory address.

If the number of ports is odd, then at the conclusion of the second pass each memory value has been inverted an odd number of times, and the even numbered segments now have values of 1, and the odd numbered segments have values of 0. In this case, the address generator is reset to 0. On the other hand, an even number of ports will have caused each memory value to be inverted an even number of times, restoring the memory contents to its original pattern at the beginning of the second pass. In this case, the address generator is set to N/P to start at the beginning of the second segment, and it counts upward, wraps around, and halts at (N/P)–1. The third pass is performed in this manner, with the state machine 702 reading (hopefully) 1's and writing 0's via port 0, and at the end of the third pass, in both cases, the memory contains the pattern at the beginning of the pass.

For the fourth pass, with an odd number of ports, the address generator 706 is set to N–1 and counts downward to 0. With an even number of ports, the address generator 706 is set to (N/P)–1, counts downward (wrapping around) to N/P. The state machine 702, control signal generator 704, and comparator 708 act as in the second pass. For the fifth pass, in both cases, the address generator 706 is set to N–1 and counts downward to 0. The state machine 702, control signal generator 704, and comparator 708 act as in the third pass. For the sixth pass, the address generator counts from 0 to N–1, and the state machine 702 provides uninverted expected data during the even numbered segments, and provides inverted expected data during the odd-numbered segments. Alternatively, the address generator counts from 0 to (N/P)–1, so that each port verifies only one segment.

It is noted that the modifications made to a single port BIST unit for adaptation to multiport memories are fairly minor, requiring little in the way of additional hardware or additional complexity. Yet the fault coverage is substantially increased, with no additional time required for completing the BIST.

Figure 7:
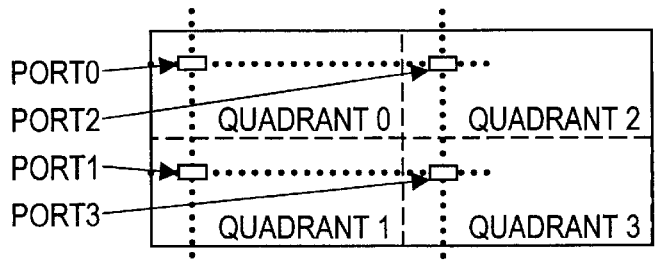
FIG. 7 shows a four port memory divided into four quadrants.

FIG. 7 shows a four port memory divided into quadrants. This configuration advantageously causes adjacent bit lines to carry complementary data values and also asserts multiple word lines in the rows being accessed. In some memory configurations, having multiple word lines asserted will aid in identifying "weak" grounding in memory cells. This occurs when multiple word line assertions causes the memory cells in a row to each drive data onto bit lines for multiple ports, rather than bit lines for just a single port. A more severe test for this fault might be provided by having all ports accessing different words in the same row. The memory for this latter embodiment is divided into a number of column groups equal to the number of ports. The column groups each consist of one or more columns of the memory array.

In any event, the multiport BIST may concurrently use single ports to apply a complete BIST to single quadrants before the ports are used to test subsequent quadrants (one-quadrant-at-a-time embodiment). Alternatively, the ports may be used to completely test a single segment before being used to test a subsequent segment (two-quadrants-at-a-time embodiment). In this embodiment, the port initially testing a quadrant on the right side "wraps around" onto the same row in the left side quadrant as the port initially testing the left side quadrant begins testing the right side quadrant. This also occurs in a third embodiment, where the quadrants are merely used to define the starting points, and each port progresses through the entire address space in each phase of the BIST (quadrant-starting-point embodiment).

Figure 6:
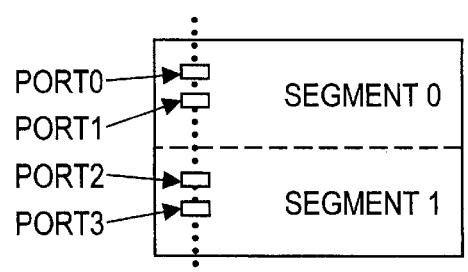
FIG. 6 shows a four port memory divided into two segments.

It is further noted that these modifications may also be applied to existing multiport BIST units (i.e. rather than adapting a single port BIST for multiport use, a multiport BIST is adapted for use on a memory with even more ports). FIG. 6 shows a four port memory divided into two segments. Ports 0 and 1 together perform a multiport BIST on segment 0, while ports 2 and 3 together perform a multiport BIST on segment 1. In an exemplary embodiment, ports 0 and 2 simultaneously perform a March C algorithm on their respective segments, while ports 1 and 3 concurrently perform "shadow" read operations. In another embodiment, ports 0 and 1 perform a dual port test on segment 0 while ports 2 and 3 perform a dual port test on segment 1. As with the previously described adaptations of a single port BIST, the multiport BISTs may use given ports to completely test a single segment before the ports are used to test a subsequent segment (one-multiport-segment-at-a-time). Alternatively, the segments may serve to merely define starting points for the ports, and the BISTs may progress through the entire address space in each phase of the BIST (multiport-segment-starting-point).

Numerous variations and modifications will become apparent to those skilled in the art once the above disclosure is fully appreciated. It is intended that the following claims be interpreted to embrace all such variations and modifications,

What is claimed is:

1. An integrated circuit device that comprises:
   a digital memory having a plurality of ports, address rows, and address columns;
   a built-in self-test (BIST) unit configured to apply a first test pattern of read and write operations to a first port of the digital memory and to concurrently apply a second test pattern of read and write operations to a second port of the digital memory, wherein addresses in the first test pattern are offset from addresses in the second test pattern by a fixed amount, wherein the offset is determined by a ratio of a number of ports to a number of address rows or address columns of the memory.

2. The integrated circuit device of claim 1, wherein the fixed amount causes read and write operations of the first port and second port to concurrently be directed to memory words that share neighboring bit lines.

3. The integrated circuit device of claim 1, wherein the first and second test patterns concurrently convey data values that are complementary.

4. The integrated circuit device of claim 3, wherein the bit lines for the first and second ports are adjacent.

5. The integrated circuit device of claim 1, wherein the BIST unit includes an address generator configured to consecutively address each memory location in the digital memory via the first port.

6. An integrated circuit device that comprises:
   a digital memory having a plurality of ports;
   a built-in self-test (BIST) unit configured to apply a first test pattern of read and write operations to a first port of the digital memory and to concurrently apply a second test pattern of read and write operations to a second port of the digital memory, wherein addresses in the first test pattern are offset from addresses in the second test pattern by a fixed amount,
   wherein the digital memory is divided into a plurality of segments, wherein each port has an assigned segment, wherein the BIST includes an address generator configured to consecutively address via the first port each memory location in the segment assigned the first port, and wherein the address generator is configured to again consecutively address via the first port each memory location in the segment assigned the first port before addressing via the first port any memory location outside the first segment.

7. The integrated circuit device of claim 1, wherein the BIST unit includes a comparator configured to compare data values concurrently received from the first and second ports to expected data values.

8. A built-in self-testing method for a multi-port memory, wherein the method comprises:
   dividing the memory into sections based on how many ports the memory includes;
   applying a first test pattern of read and write operations to a first port of the multi-port memory; and
   concurrently applying a second test pattern of read and write operations to a second port of the multi-port memory,
   wherein addresses in the first test pattern are offset from addresses in the second test pattern by a fixed amount.

9. The method of claim 8, wherein the fixed amount causes read and write operations on the first port and second port to concurrently be directed to memory words that share neighboring bit lines.

10. The method of claim 8, wherein the first and second test patterns concurrently convey data values that are complementary.

11. The method of claim 10, wherein the bit lines for the first and second ports are adjacent.

12. The method of claim 8, wherein said applying includes:
   consecutively addressing each memory location in the multi-port memory via the first port.

13. A built-in self-testing method for a multi-port memory, wherein the method comprises:
   applying a first test pattern of read and write operations to a first port of the multi-port memory; and
   concurrently applying a second test pattern of read and write operations to a second port of the multi-port memory,
   wherein addresses in the first test pattern are offset from addresses in the second test pattern by a fixed amount,
   wherein the multi-port memory is divided into a plurality of segments, wherein each port has an assigned segment, and wherein said applying includes:
   consecutively addressing via the first port each memory location in the segment assigned the first port; and
   again consecutively addressing via the first port each memory location in the segment assigned the first port before addressing via the first port any memory location outside the first segment.

14. The method of claim 8, further comprising:
   comparing data values concurrently received from the first and second ports to expected data values.

15. An integrated circuit device that comprises:
   a digital memory having a plurality of ports, wherein separate segments of the memory are associated with separate ports;
   a built-in self-test (BIST) unit configured to apply a first test pattern of read and write operations to a first port of the digital memory and to concurrently apply a second test pattern of read and write operations to a second port of the digital memory, wherein addresses in the first test pattern are offset from addresses in the second test pattern by a fixed amount,
   wherein the fixed amount causes read and write operations of the first port and second port to concurrently be directed to memory words that share neighboring word lines.

16. The integrated circuit device of claim 15, wherein the first and second test patterns concurrently convey data values that are complementary.

17. The integrated circuit device of claim 15, wherein the word lines for the first and second ports are adjacent.

18. The integrated circuit device of claim 15, wherein the BIST unit includes an address generator configured to consecutively address each memory location in the digital memory via the first port.

19. The integrated circuit device of claim 15, wherein the BIST unit includes a comparator configured to compare data values concurrently received from the first and second ports to expected data values.

20. An integrated circuit device that comprises:

a digital memory having a plurality of ports;

a built-in self-test (BIST) unit configured to apply a first test pattern of read and write operations to a first port of the digital memory and to concurrently apply a second test pattern of read and write operations to a second port of the digital memory, wherein addresses in the first test pattern are offset from addresses in the second test pattern by a fixed amount, wherein the digital memory is divided into a plurality of column groups, wherein each port has an assigned column group, wherein the BIST includes an address generator configured to consecutively address via the first port each memory location in the column group assigned the first port, and wherein the address generator is configured to again consecutively address via the first port each memory location in the column group assigned the first port before addressing via the first port any memory location outside the first column group.

\* \* \* \* \*